United States Patent [19]

Suzuki et al.

[11] 4,088,958
[45] May 9, 1978

[54] INTEGRATED CIRCUIT FOR A PROGRAMMABLE TELEVISION RECEIVER

[75] Inventors: Yasoji Suzuki, Ayase; Tomohisa Shigematsu, Yokohama; Nawoyuki Kokado, Tokyo; Yukinori Kudo, Fujisawa, all of Japan

[73] Assignee: Tokyo Shibaura Electric Co., Ltd., Kawasaki, Japan

[21] Appl. No.: 722,761

[22] Filed: Sep. 13, 1976

[30] Foreign Application Priority Data

Sep. 17, 1975 Japan .............................. 50-111680

[51] Int. Cl.² .............................................. H04B 1/16
[52] U.S. Cl. .................................................. 325/396
[58] Field of Search ............... 325/395, 396, 453, 464, 325/468, 455; 358/191, 192

[56] References Cited

U.S. PATENT DOCUMENTS

| 3,800,230 | 3/1974 | Marks et al. | 325/396 |
| 3,818,352 | 6/1974 | Moran | 325/396 |
| 4,004,085 | 1/1977 | Makino et al. | 325/396 |

OTHER PUBLICATIONS

"Electronics," vol. 47, No. 1, Jan. 10, 1974, pp. 36–37.
"Electronics," vol. 48, No. 24, Nov. 1975, pp. 5E–6E.
"Funkschau," vol. 47, No. 16, Aug. 1975, pp. 37–38.

*Primary Examiner*—Robert L. Griffin
*Assistant Examiner*—Marc E. Bookbinder
*Attorney, Agent, or Firm*—Oblon, Fisher, Spivak, McClelland & Maier

[57] ABSTRACT

An integrated circuit for a programmable television receiver comprises a memory for storing a plurality of programs, a digital clock and a character generating circuit for generating character signals for displaying the programs in the memory and/or time of the digital clock on the screen of a television receiver. The integrated circuit uses dynamic circuits to reduce the number of elements required, and CMOS transistors to attain a lower power dissipation.

5 Claims, 20 Drawing Figures

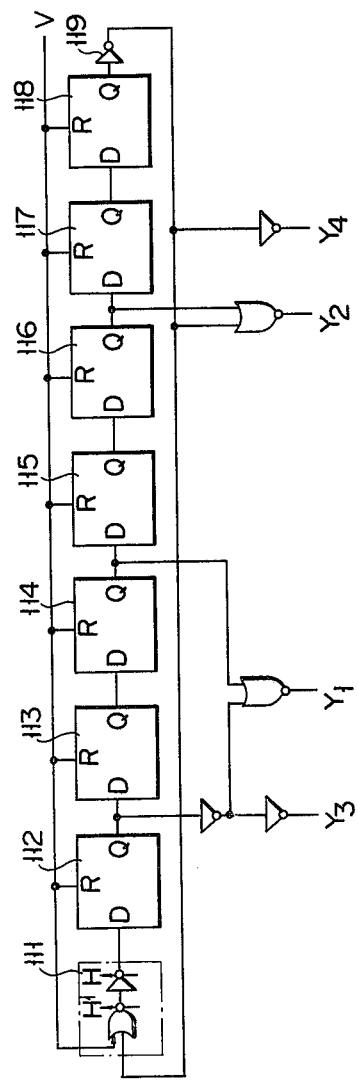
F I G. 10A
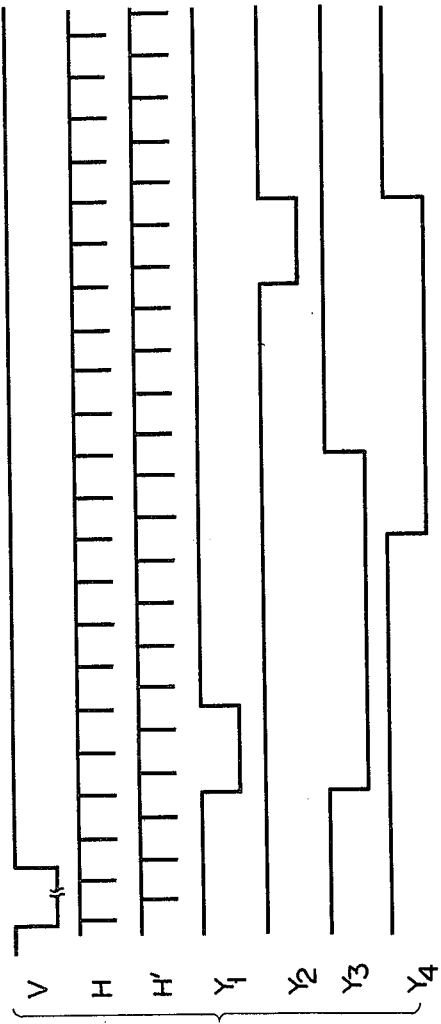
F I G. 10B

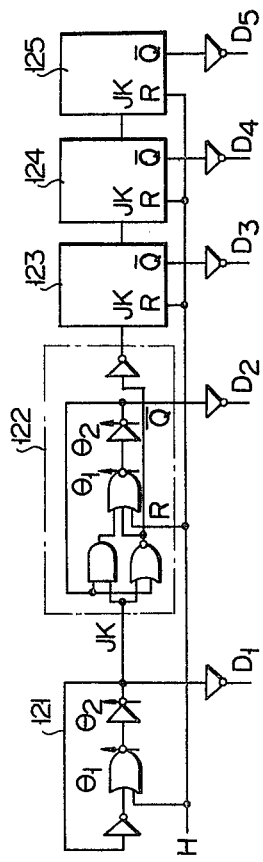
F I G. 11A
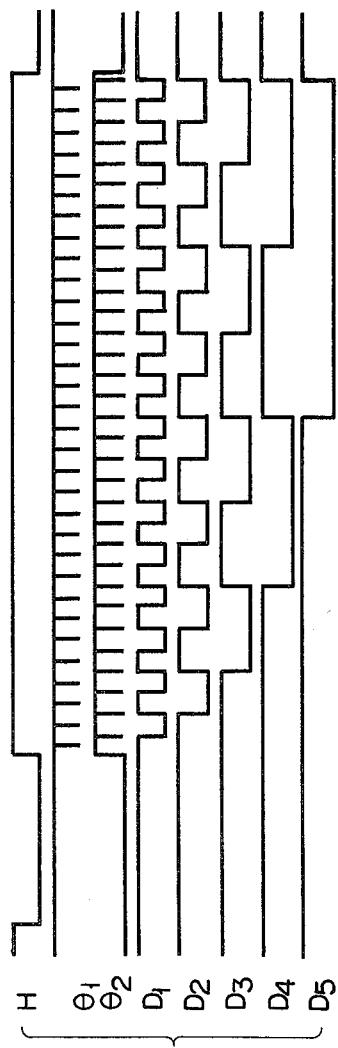
F I G. 11B

CLOCKED INVERTER

F I G. 16
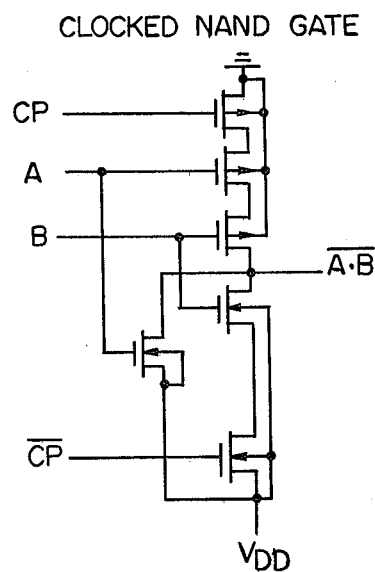
F I G. 17
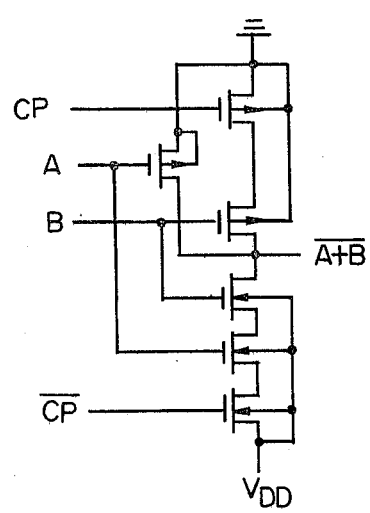

INTEGRATED CIRCUIT FOR A PROGRAMMABLE TELEVISION RECEIVER

This invention relates to a program memory built-in integrated circuit for a programmable television receiver.

A programmable TV receiver capable of preliminarily setting the time and channel number of a desired television program has recently been developed. In this case, the television receiver is automatically switched ON and OFF when a programmed time comes. Most of such programmable TV receivers use a mechanically operated clock and memory and have the drawbacks that only a lesser number of programs can be memorized. The use of the electronic memory and digital electronic clock leads to a prominent increase in the number of storable programs and also provides an accurate counting of time. The use of electronic devices permits a stored content (time and channel number) to be displayed on the screen of CRT of a TV set. When such electronic memory and electronic digital clock are realized by discrete elements, a programming device is made bulkier, incurring a high cost. In order to attain miniaturization of the device at low cost the adoption of integrated circuit is considered. However, problem arises from the standpoint of a restricted chip size when all the circuits necessary for a programmable device is integrated into an integrated circuit.

In an electronic programmable device it is necessary to prevent the content of the memory and of the digital clock from being erased when an AC power source is turned OFF. In order to prevent such a situation, switching must be effected from the power source to a dry cell. In this case, the power consumption of the programmable device must be restricted.

It is accordingly the object of this invention to provide a CMOS integrated circuit which has a low power dissipation and incorporates a memory, digital clock, character generating circuit, etc., necessary for a programmable television receiver in a chip of practical size.

According to this invention there is provided an integrated circuit for use in a programmable television receiver comprising an oscillator to which a quartz crystal is to be externally coupled; a digital clock coupled to said oscillator; a memory adapted to store a plurality of programs each including a time data and a channel data and having a plurality of recirculating dynamic shift registers each for storing one program; a character generating circuit coupled to said memory and adapted to generate character signals to permit the content of said memory to be displayed on the screen of a cathode ray tube of a television receiver; circuit means coupled to the output of said oscillator to generate shift pulses for driving said recirculating dynamic shift registers in said memory; time comparison means coupled to the outputs of said memory and said digital clock for comparing the time data in said memory and the time of said digital clock; and means responsive to said time comparing means to form a program execution output when a coincidence occurs between the time data in said memory and the time of said digital clock.

This invention can be more fully understood from the following detailed description when taken in conjunction with the accompanying drawings, in which:

FIG. 10A shows a circuit arrangement of a vertical component pulse generator in FIG. 1;

FIG. 10B is a timing chart of the vertical component pulse generator of FIG. 10A;

FIG. 11A is a horizontal digit designation pulse generator (horizontal position counter) in FIG. 1;

FIG. 11B is a timing chart of FIG. 11A;

FIG. 16 is a circuit arrangement of a CMOS clocked NAND gate; and

FIG. 17 is a circuit arrangement of a CMOS clocked NOR gate.

Figure 1:
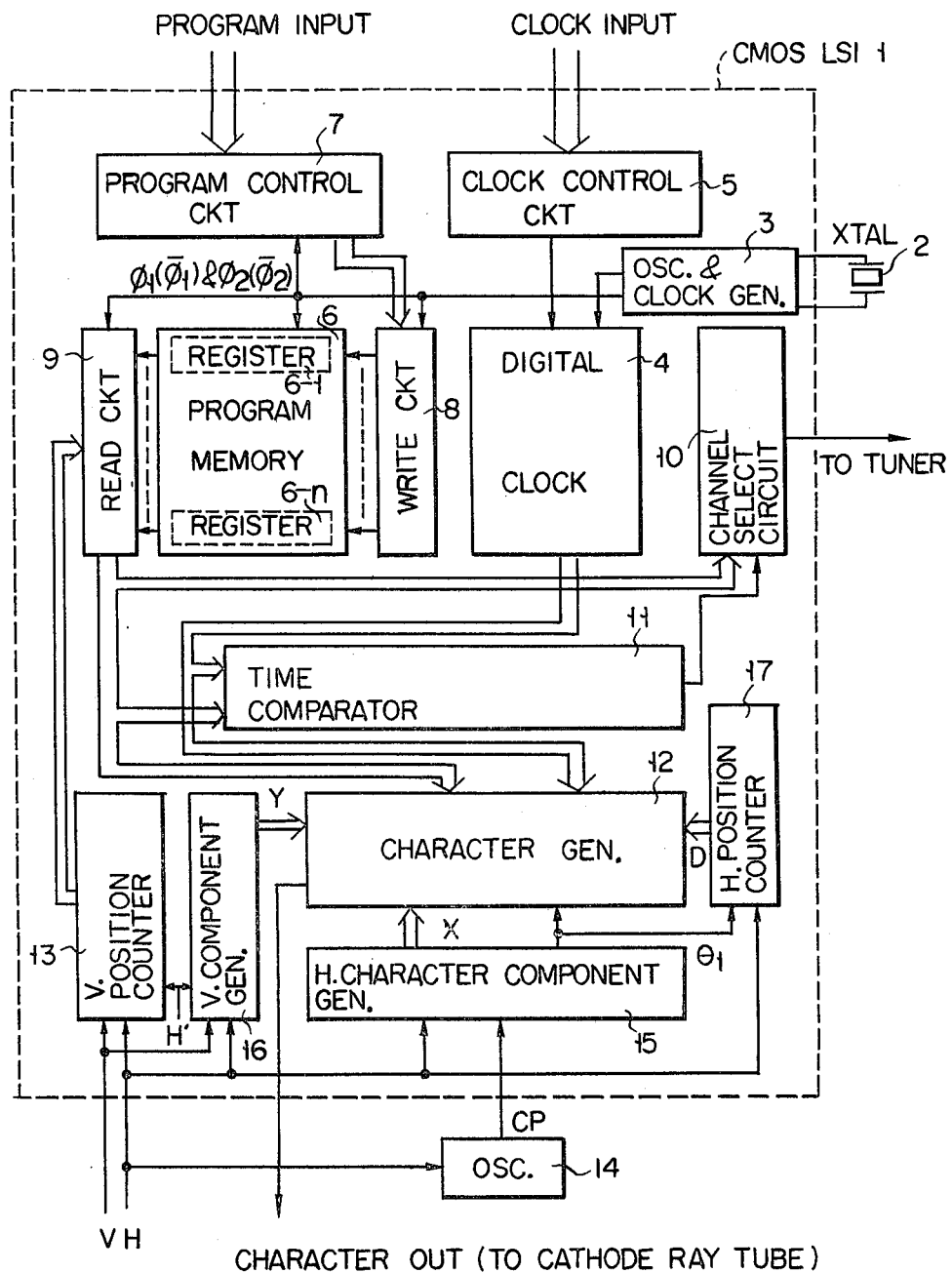
FIG. 1 is a schematic block diagram of a programmable integrated circuit according to this invention.
Figure 2:
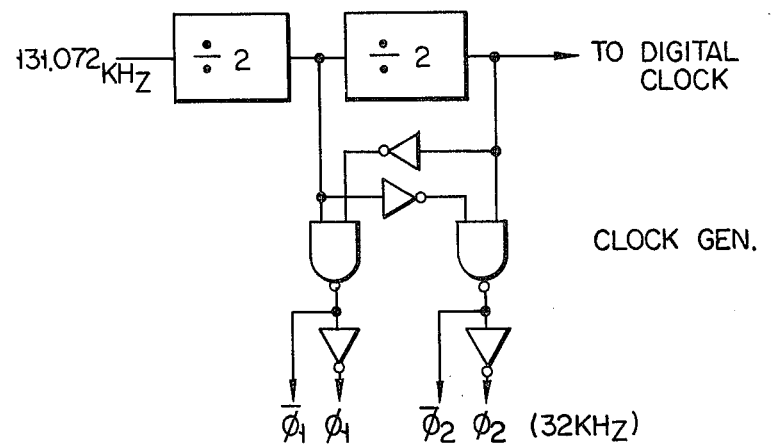
FIG. 2 is a circuit arrangement of a clock generator in FIG. 1.

FIG. 1 shows a schematic block diagram of a programmable CMOS LSI according to one embodiment of this invention. A quartz crystal 2 is coupled from the outside of CMOS LSI 1 to a crystal oscillator 3. The crystal oscillator 3 is adapted to oscillate at about 4.19 MHz. The output of oscillator 3 is a frequency-divided by a frequency divider chain in the clock generator 3 and the frequency-divided output with a predetermined frequency is counted by a digital clock 4. A clock generator as shown in FIG. 2, which is included in the oscillator, generates, for example, about 32 kHz clock pulses $\phi_1(\bar{\phi}_1)$ and $\phi_2(\bar{\phi}_2)$. The digital clock 4 is subjected by a clock control circuit 5 to a time correction etc. Reference numeral 6 is a memory capable of storing a plurality of programs each including, for example, hour data, minute data and channel data. A program input is applied to a program control circuit 7 and a parallel binary data from the program control circuit is applied to a write circuit 8 where it is converted to a serial binary data. The serial binary data from the write circuit 8 is stored in the program memory 6. The memory 6 comprises a plurality of recirculating dynamic shift registers 6-1, . . . 6-n, each of which is adapted to store one program. The selction of the shift registers during a program write time is effected by a write address counter in the program control circuit 7.

Figure 3:
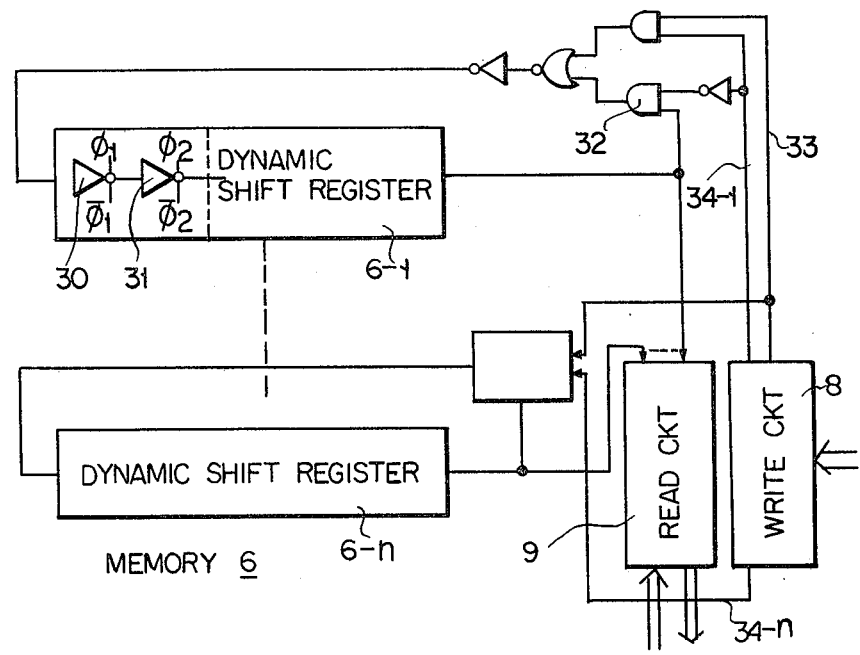
FIG. 3 is a circuit arrangement of a memory in FIG. 1.

Each one-bit stage of the shift register is comprised of cascade-connected clocked inverter 30 and 31 as shown in FIG. 3. The content of the shift register is circulated through a gate 32. The clocked inverter 30 is driven by clock pulses $\phi_1$ and $\overline{\phi}_1$ from the clock generator and the clocked inverter 31 is driven by clock pulses $\phi_2$ and $\overline{\phi}_2$. In FIG. 3, reference numeral 33 is a data line for use in writing the data from the write circuit 8 into the shift register and reference numerals 34-1, . . . 34-$n$ are address lines used to select the shift register into which a program is to be written.

Figure 6:
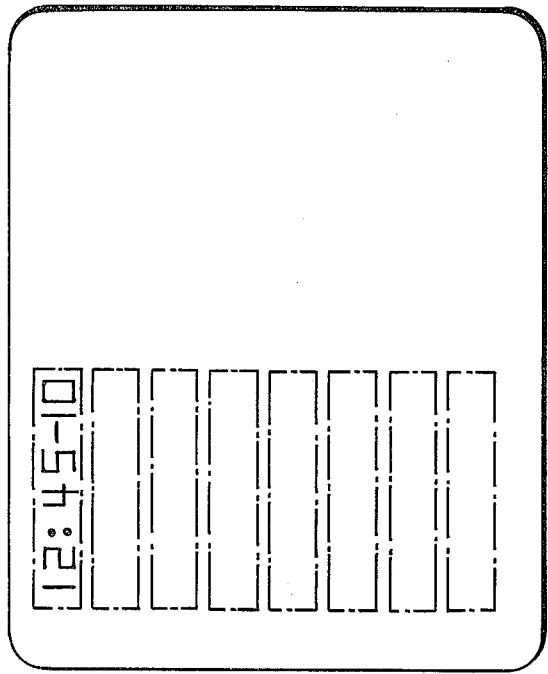
FIG. 6 shows programs displayed on the screen of the TV receiver.

The program data of the respective shift registers 6-1, . . . 6-$n$ are displayed in the corresponding positions on a screen of CRT, for example, as shown in FIG. 6. The program data is displayed in synchronism with a CRT scanning. Readout address signals for shift register selection are formed by a vertical position counter 13 adapted to count horizontal flyback pulses H in a TV receiver. A read circuit 9 is adapted to sequentially read out, by the readout address signals, program data stored in the shift registers 6-1, . . . 6$n$ in the memory. The read circuit 9 serially reads out the data of each shift register and the serial readout data is converted to a parallel data.

The program data read out from the shift registers by the read circuit 9 are fed to the character generator 12, only time data out of the program data are fed to a time comparator 11 and only channel data out of the program data are fed to a channel selection circuit 10. The time data from the digital clock 4 are applied to the time comparator 11 for comparison with the time data of each program. When a coincidence occurs between the time data of the digital clock 4 and the time data of the program, the time comparator 11 produces a coincidence output and delivers it to the channel selction circuit 10 to hold and decode the channel data and the channel selection circuit emits a program execution output. The channel selection circuit 10 converts the channel data to a DC voltage of predetermined magnitude corresponding to the channel and delivers it to an electronic tuner for selection of the desired channel.

The memory, digital clock and the associated circuits can be dynamically driven by clock pulses which are formed by crystal oscillation. Since, however, the character generating circuit for use in displaying the program data on the screen of CRT must always operate in synchronism with the CRT scanning, it is impossible to use crystal oscillation pulses. For character pattern generation the character generation circuit should be dynamically driven by oscillation pulses of a character pattern generating circuit.

In FIG. 1 reference numeral 14 is a gated oscillator responsive to the horizontal synchronizing pulses H to generate horizontal timing pulses CP of, for example, 4.5 MHz higher than the frequency of horizontal synchronizing pulse H, the horizontal timing pulse CP defining a unit length for use in horizontally displaying characters on CRT. The oscillation starting point of the gated oscillator is in synchronism with the rise of the horizontal synchronizing pulse. The use of the pulse CP permits elimination of vertical jitters of a display pattern on the CRT.

The display of a program data will be explained below using a character pattern constituted of eight segments.

Figure 5:
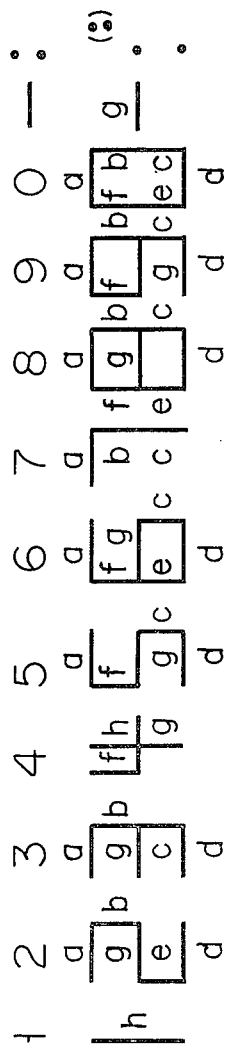
FIG. 5 shows a relation of each numeral to the segments of a character pattern.
Figure 4:
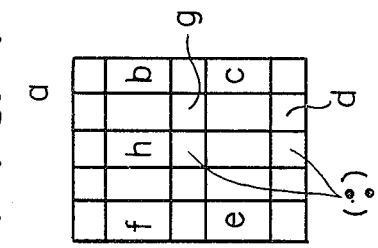
FIG. 4 shows a character pattern used for displaying programs on the screen of a TV receiver.

Provided that the eight segments be named $a$, $b$, $c$, $d$, $e$, $f$, $g$ and $h$ as shown in FIG. 4, the numeric characters are constituted by the segments as shown in FIG. 5.

Explanation will be made in connection with the character pattern generating circuit supposing that eight programs are displayed in eight rows on CRT using the character pattern. To display a program for selecting, for example, 10 channel at 45 minutes past 12 o'clock, one program requires eight digits, i.e., two digits for a hour data, two digits for a minute data, two digits for a channel data, one code (:) for hour-minute data separation and one code (-) for minute-channel data separation.

By way of example of this invention one digit is horizontally divided into eight sections, i.e., the five sections for a character pattern display and the remaining three sections for an inter-pattern spacing. In the vertical direction, 16 periods of the horizontal synchronizing pulse H for CRT scanning is alloted to one row display, i.e., two periods for an inter-row spacing and the remaining 14 periods for character pattern display.

A horizontal component pulse generator 15 is adapted to count output pulses CP from the gated oscillator 14 and generate horizontal component pulses $X_1$ to $X_4$ corresponding to the horizontal components of the segments of each character and having a horizontal one digit display period and clock pulses $\theta_1$ ($\overline{\theta}_1$) having the horizontal one digit display period. A vertical component pulse generator 16 is adapted to count horizontal synchronizing pulses H during one vertical scanning period and generate vertical component pulses $Y_1$ to $Y_4$ corresponding to the vertical components of the segments of each character and having a period corresponding to 16 periods of the horizontal synchronizing pulse H.

Figure 7:
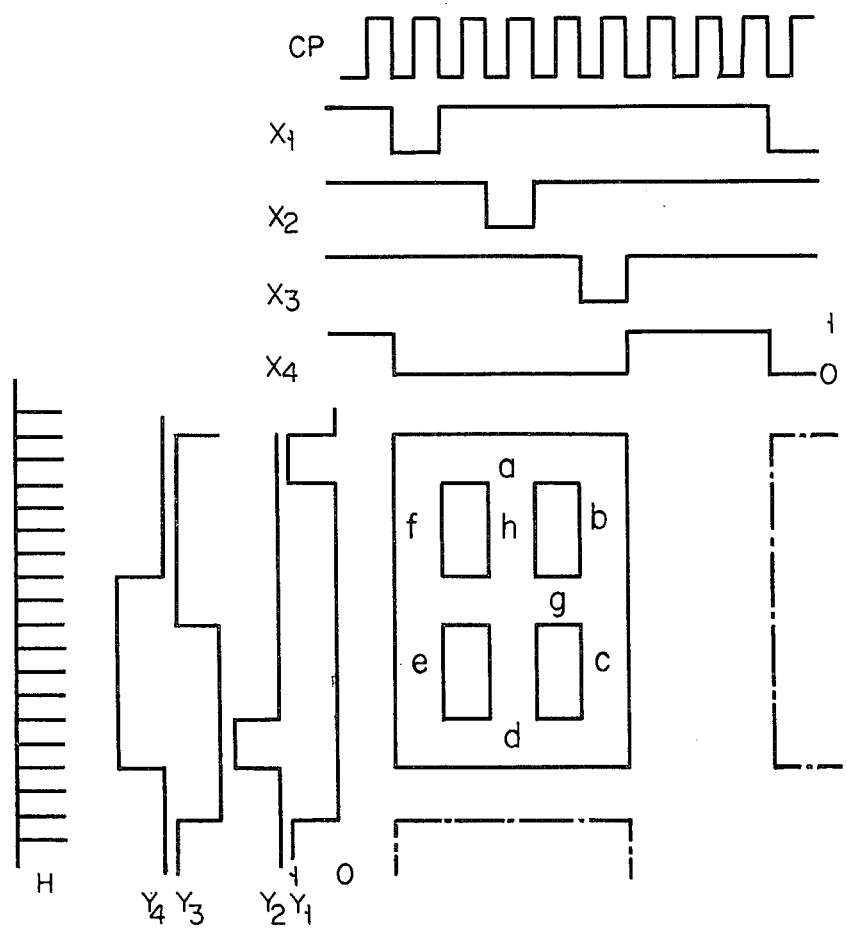
FIG. 7 shows relation of a character pattern to horizontal and vertical component pulses.

FIG. 7 shows a relation between the character segments, horizontal timing pulse CP, horizontal component pulses $X_1$ to $X_4$ and vertical component pulses $Y_1$ to $Y_4$.

The horizontal one-digit display period corresponds to eight periods of the timing pulse CP. Five periods of the clock pulses are alloted to one character pattern and three periods of the clock pulses are alloted to the inter-pattern spacing. The relation of each character segment to the horizontal component pulses $X_1$ to $X_4$ and vertical component pulses $Y_1$ to $Y_4$ is as follows:

$a = X_4 \cdot Y_1$
$b = X_3 \cdot Y_3$
$c = X_3 \cdot Y_4$
$d = X_4 \cdot Y_2$
$e = X_1 \cdot Y_4$
$f = X_1 \cdot Y_3$
$g = X_4 \cdot Y_3 \cdot Y_4$
$h = X_2 \cdot (Y_3 + Y_4)$
$(:) = X_2 \cdot (Y_3 \cdot Y_4 + Y_2)$ Referring to FIG. 1 a horizontal position counter 17 is adapted to count clock pulse $\theta$ with a horizontal one-digit display period as generated from the horizontal component pulse generator 15 and generate horizontal display digit designation pulses $D_1$ to $D_5$ for permitting each digit of program data to be located at a predetermined position on the screen of CRT. The character generator 12 generates character signals for displaying a program data from the memory 6 and/or a time data from the digital clock 4 on the screen of CRT is response to vertical component pulse $Y_1$ to $Y_4$, horizontal component pulses $X_1$ to $X_4$ and digit position designation pulses $D_1$ to $D_5$.

Figure 8:
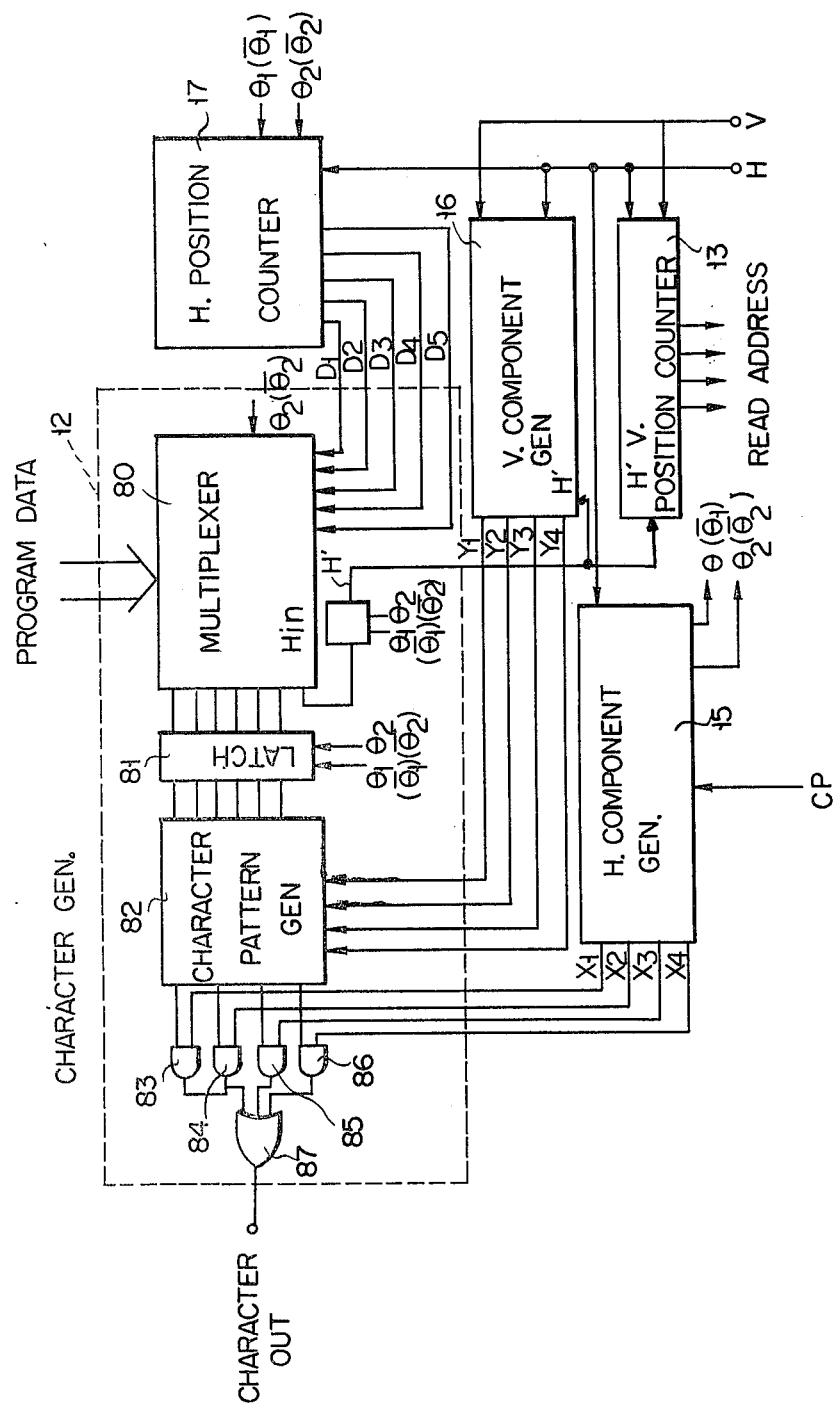
FIG. 8 is a detailed arrangement of a character generator in FIG. 1.

FIG. 8 shows the character generator 12 in more detail and the surrounding circuits thereof. A multiplexer 80 is adapted to multiplex parallel program data in response to the digit designation pulses $D_1$ to $D_5$ from the horizontal position counter 17 and send a time data, minute data and channel data by one digit to a latch circuit 81 in the order of this. The latch circuit is comprised of flip-flop circuits and delays the outputs of the multiplexer by one digit display period.

The outputs of the latch circuit 81 is applied to a character pattern generator 82. The character pattern generator 82 decodes multiplexed program binary data into 8-segment outputs and classifies the segment decoded outputs by vertical component pulses $Y_1$ to $Y_4$ into horizontal components. The so classified outputs of the character pattern generator 82 are supplied, together with the horizontal component pulses $X_1$, $X_2$, $X_3$ and $X_4$, to AND circuits 83, 84, 85 and 86. The outputs of the AND circuits are supplied to an OR circuit 87 to produce character signals one digit after another.

Each circuit of the horizontal component pulse generator, vertical component pulse generator, digit designation pulse generator, multiplexer and character pattern generator will be explained by way of example.

Figure 9A:
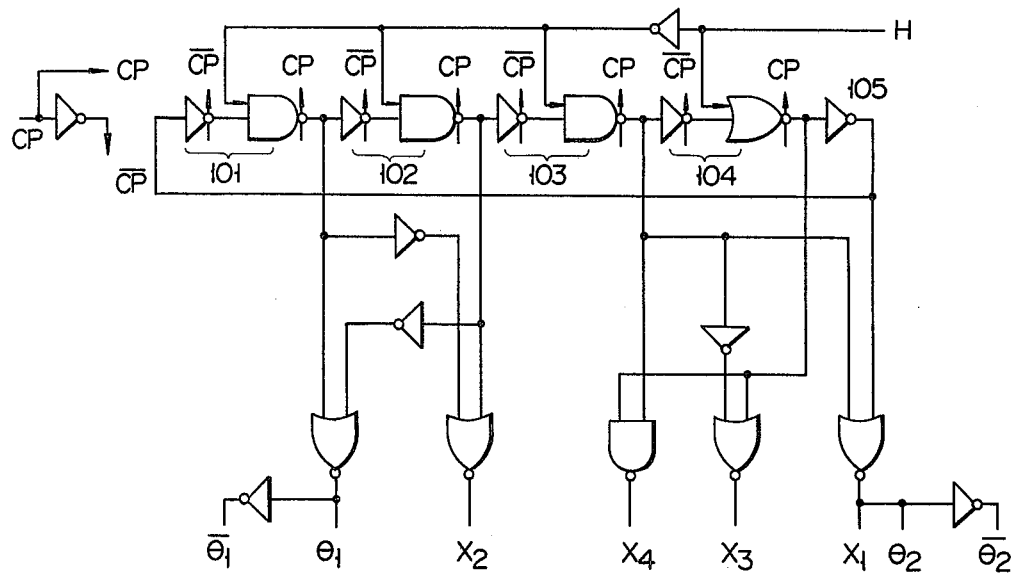
FIG. 9A is a circuit arrangement of a horizontal component pulse generating circuit in FIG. 1.
Figure 9B:
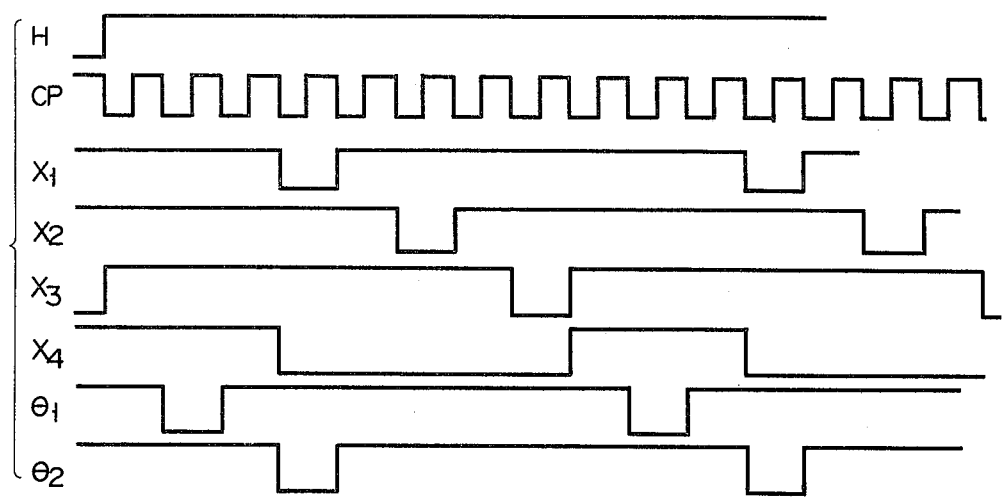
FIG. 9B shows a timing chart of the horizontal component pulse generating circuit of FIG. 9A.

FIG. 9A shows a circuit diagram of the horizontal component pulse generator and FIG. 9B shows its timing chart. The horizontal component pulse generator includes a scale-of-8 dynamic counter comprising an inverter 105 and four stage dynamic shift registers 101 to 104 each having a reset input. The horizontal component pulse generator counts horizontal timing pulses CP and generates horizontal component pulses $X_1$ to $X_4$ and clock pulses $\theta_1$ and $\theta_2$ as shown in FIG. 9B. The dynamic counter is reset by the horizontal synchronizing pulse H. A clocked NAND gate and clocked NOR gate each having a reset input are comprised of complementary MOS transistors as shown in FIGS. 16 and 17 respectively.

FIG. 10A is a circuit diagram of the vertical component pulse generator 16 and FIG. 10B shows its time chart. The vertical component pulse generator includes a scale-of-16 dynamic counter comprising an inverter 119 and eight-stage dynamic shift registers 111 to 118 each having a reset input. The vertical component pulse generator counts horizontal synchronizing pulses H and generate vertical component pulses $Y_1$ to $Y_4$ as shown in FIG. 11B. The dynamic counter is reset by vertical synchronizing pulses V.

FIG. 11A is a circuit arrangement of the horizontal digit designation pulse generator 17 and FIG. 11B shows its timing chart. The horizontal digit designation pulse generator includes a scale-of-32 ($2^5$) dynamic counter having a cascade connection of five dynamic binary counters 121, 122, 123, 124 and 125. The horizontal digit designation pulse generator is adapted to count clock pulses $\theta_1$ and $\theta_2$ having a horizontal one-digit display period and generate horizontal digit designation pulses $D_1$ to $D_5$.

A vertical position counter 13 is adapted to count horizontal synchronizing pulses H and deliver to the read circuit 9 address signals for selecting the shift register in the memory 6. The vertical position counter 13 can be constructed in a similar way as the horizontal position counter 17.

Figure 12:
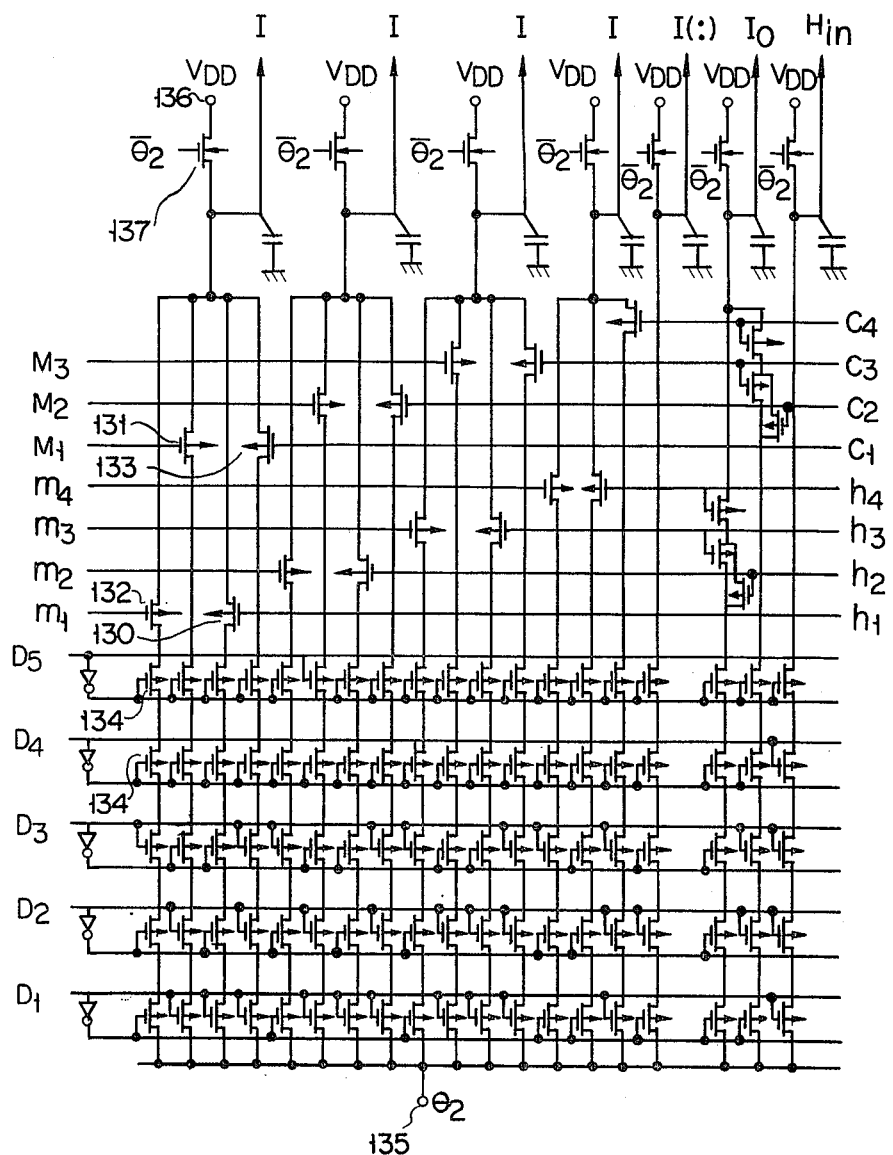
FIG. 12 is a circuit arrangement of a multiplexer in FIG. 12.
Figure 13:
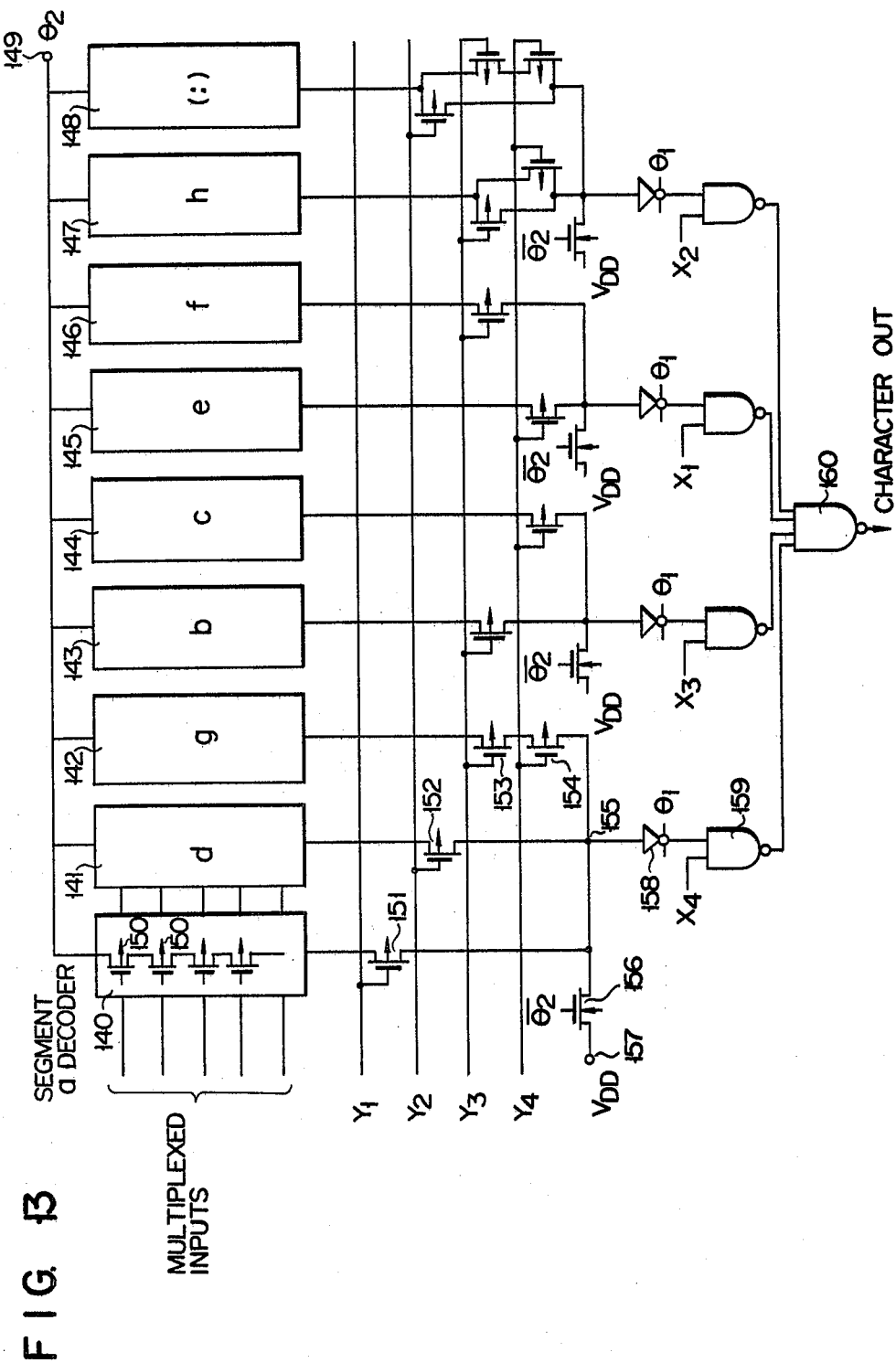
FIG. 13 is a circuit arrangement of the character pattern generating circuit in FIG. 8.

FIG. 12 shows a circuit arrangement of the multiplexer 80. In this Figure, $h_1$, $h_2$, $h_3$ and $h_4$ show hour binary data; $M_1$, $M_2$ and $M_3$ show 10-minute binary data; $m_1$, $m_2$, $m_3$ and $m_4$ show 1-minute binary data, and $C_1$, $C_2$, $C_3$ and $C_4$ show binary data of the channel number. The same weight bearing bit data of each binary data is applied to the gates of P-channel MOS transistors connected to a corresponding output. For example, the most significant bit data $h_1$, $M_1$, $m_1$ and $C_1$ are supplied to the gates of transistors 130, 131, 132 and 133, respectively, which are connected to an output $I_1$. Each of the transistor 130 to 133 is connected to a first potential point 135 to which a clock pulse $\theta_2$ is applied through five series-connected P-channel transistors 134 the gates of which are coupled to the horizontal digit designation pulse generator. The output $I_1$ is connected to a second potential point 136 through an n-channel transistor 137 to the gate of which is applied a clock pulse $\bar{\theta}_2$. Upon receipt of a clock pulse $\bar{\theta}_2$ each output of the multiplexer is precharged to a low voltage level and when transistors connected between each output and the first potential point 135 are rendered conductive the output is discharged to a high voltage level. The hour data, 10-minute data, 1-minute data and channel data are multiplexed by horizontal digit designation pulses $D_1$ to $D_5$. The multiplexer also generates a pattern signal (:) for separating the hour data and the minute data. As shown in FIG. 13 the outputs of the multiplexer are applied to the segment decoders 140 to 148. In each segment decoder a plurality of series circuits each comprising series-connected P-channel transistors 150 (see the segment a decoder), to the gates of which binary data are applied, are connected in parallel. In the segment a decoder 140, since the number of characters requiring the segment a for display is eight as shown in FIG. 5 the eight series circuits are connected in parallel. One end of the series circuit is connected to a first potential point 149 to which is applied a clock pulse $\theta_2$. When binary data corresponding to any of "2," "3," "5," "6," "7," "8," "9," and "0" is applied, the transistors 150 are rendered conductive and therefore the segment a decoder generates a decoded output.

As shown in FIG. 7 the character segments $a$, $g$ and $d$ correspond to the horizontal component pulse $X_4$; the segments $b$ and $c$ to the component pulse $X_3$; the segments $e$ and $f$ to the component pulse $X_1$; and the segment $h$ and (:) to the component pulse $X_2$. As shown in FIG. 13, the segment decoders are classified for each horizontal segment pulse. Consider the segment decoders 140, 141, 142 for instance. The output of the decoder 140 is connected through a P-channel transistor 151 to a circuit point 155, the output of the decoder 141 is connected through a P-channel transistor 152 to the circuit point 155, and the output of the decoder 142 is connected through transistors 153 and 154 to the circuit point 155.

Since the segment a corresponds to the vertical component pulse $Y_1$ the vertical component pulse $Y_1$ is applied to the gate of the transistor 151. The segment d corresponds to the vertical component pulse $Y_2$ and in consequence the vertical component pulse $Y_2$ is applied to the gate of the transistor 152. The segment g corresponds to the vertical component pulses $Y_3$ and $Y_4$ and in consequence the vertical component pulses $Y_3$ and $Y_4$ are applied to the gates of the transistors 153 and 154 constituting an AND gate, respectively. The circuit point 155 is connected to a second potential terminal 157 through an n-channel transistor 156 to the gate of which is applied a clock pulse $\theta_2$. The circuit point 155 is connected through a clocked inverter 158 driven by clock pulses $\bar{\theta}_1$, $\theta_1$ to one input of a NAND gate 159 to the other input of which is applied the horizontal component pulse $X_4$. The outputs of the gates 159 to which corresponding horizontal component pulses are respectively applied to a NAND gate 160 which forms a character signal.

Figure 14:
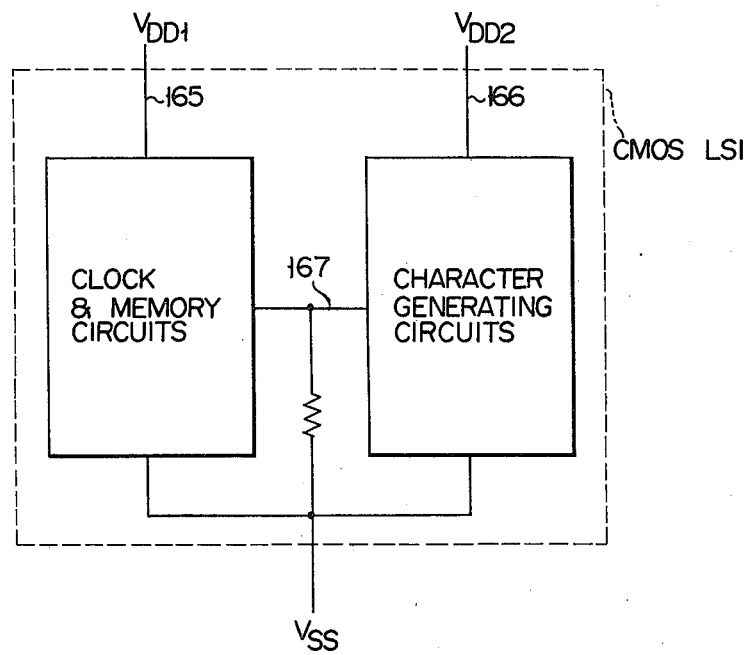
FIG. 14 shows a connection relation between the memory and clock circuits and character generating circuit in FIG. 1.
Figure 15:
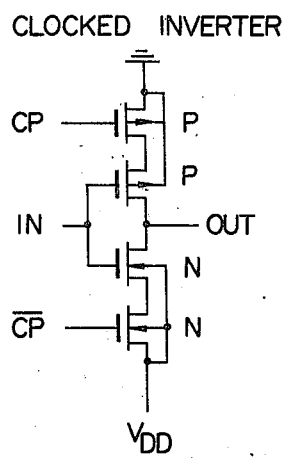
FIG. 15 is a circuit arrangement of a CMOS clocked inverter used in this invention.

Since dynamic circuits are used in the integrated circuit according to this invention, it is possible to prominently reduce the number of devices as compared with static circuits. The use of CMOS transistors leads to a small power dissipation. Now consider the power dissipation for instance. The oscillation frequency of a crystal oscillator is about 4 MHz, the pulse CP for character pattern generation is about 4.5 MHz and the power source voltage is about 4.5V. In this case, the power dissipation is several mW. To prevent the destruction of a program data and digital clock time data during power failure, a dry cell will be requied. In this case, it is not necessary that all the circuits be driven by the dry cell and it is only necessary that the memory and digital clock be driven. Separate power supply lines may be provided to drive the character generating circuit by an AC power source and to drive the memory and digital clock by the dry battery. In this case, the service life of the dry cell can be extended. As shown in FIG. 14, therefore, it is desired that the clock and memory circuits be connecteed over a first power supply line 165 to the dry cell and the character generating circuit be connected over a second power supply line 166 to the AC power source. A resistor R is provided to pull a signal line 167 toward $V_{SS}$ so as to prevent that signals of the character generator become unstable to exert a bad influence over the memory and clock circuits. The value of the resistor R may be about 500 kiloohms.

What we claim is:

1. An integrated circuit for use in a programmable television receiver comprising:
   an oscillator to which a quartz crystal is to be externally coupled;
   a digital clock coupled to said oscillator;
   a memory for storing a plurality of programs each including time data and associated channel data and having a plurality of recirculating dynamic shift registers each adapted to store one program;
   a character generating circuit coupled to said memory and adapted to generate character signals to permit the content of said memory to be displayed on the screen of a cathode ray tube of a television receiver;
   circuit means coupled to the output of said oscillator to generate shift pulses for driving said recirculating dynamic shift registers in said memory;
   time comparision means coupled to the outputs of said memory and said digital clock for comparing the time data in said memory and the time of said digital clock;
   means to readout said channel data from said memory; and
   means responsive to said time comparing means and said readout means to form a program execution output based on said channel data when a coincidence occurs between the time data in said memory and the time of said digital clock.

2. An integrated circuit according to claim 1, in which said character generating circuit comprises:
   an input for receiving horizontal timing pulses which synchronize with horizontal synchronizing pulses of the television receiver, have a frequency higher than that of the horizontal synchronizing pulse and provide a unit length in displaying characters in the horizontal direction of the cathode ray tube;
   a horizontal component pulse generating circuit responsive to the horizontal timing pulses for generating horizontal component pulses which provide horizontal components of each character and have a horizontal one-digit display period, and clock pulses having the horizontal one-digit display period;
   a horizontal display digit designation pulse generating circuit connected to said horizontal component pulse generating circuit to generate horizontal display digit designation pulses in response to the clock pulses;
   a vertical component pulse generating circuit for generating vertical component pulses which provide vertical components of each character in response to the horizontal synchronizng pulse in the television receiver;
   a multiplexer connected to said memory and said horizontal display digit designation pulse generating circuit to deliver hour data, minute data and channel data in the binary form from said memory in a predetermined sequence in response to said horizontal display digit designation pulses;
   segment decoders for decoding the outputs of said multiplexer and generating segment outputs; and
   output circuit means for generating character signals during each horizontal one-digit display period in response to the outputs of said segment decoders, said horizontal components pulses and said vertical component pulses.

3. An integrated circuit according to claim 2, in which said multiplexer includes a plurality of series-connected circuits each having a plurality of first MOS transistors of first channel type connected between each bit output of said multiplexer and a first potential point, the gate of one MOS transistor in each series circuit being connected to receive a binary signal having the same weight of each data and the gates of the remaining MOS transistors in each series circuit being connected to receive display digit designation pulses from said display digit designation pulse generating circuit; and a second MOS transistor of second channel type connected between the bit output and a second potential point, the gate of said second MOS transistor being connected to receive one clock pulse from said digit designation pulse generating circuit.

4. An integrated circuit according to claim 2, in which said segment decoders each include a plurality of first MOS transistors of first channel type connected between a decoder output and a first potential point, the gates of said first MOS transistors being connected to receive respective outputs of said multiplexer, and said output circuit means includes a second MOS transistor of the first channel type connected between a circuit point and each output of those segment decoders corresponding to the same horizontal component of the character and having a gate connected to receive from said vertical component pulse generating circuit a vertical component pulse associated with the horizontal component, a third MOS transistor of a second channel type connected between said circuit point and a second potential point and having a gate connected to receive one clock pulse from said display digit designation pulse generating circuit, a CMOS clocked inverter connected to said circuit point and adapted to be driven by clock pulses from said display digit designation pulse generating circuit which are different in phase from the clock pulse applied to the gate of said third transistor, and logic circuit means for gating the output of said clocked inverter in response to the corresponding horizontal component pulse.

5. An integrated circuit according to claim 1, in which said memory and digital clock are connected to a first power source line and said character generating circuit is connected to a second power source line.

* * * * *